United States Patent [19]

Kato

[11] Patent Number: 5,648,280

[45] Date of Patent: Jul. 15, 1997

[54] METHOD FOR FABRICATING A BIPOLAR TRANSISTOR WITH A BASE LAYER HAVING AN EXTREMELY LOW RESISTANCE

[75] Inventor: Hirosi Kato, Tokyo, Japan

[73] Assignee: NEC Corporation, Tokyo, Japan

[21] Appl. No.: 533,850

[22] Filed: Sep. 26, 1995

[30] Foreign Application Priority Data

Sep. 26, 1994 [JP] Japan .................... 6-229891

[51] Int. Cl.$^6$ .................................. H01L 21/265
[52] U.S. Cl. .................... 437/31; 437/89; 437/90; 437/99; 437/131
[58] Field of Search .................... 437/31, 32, 89, 437/90, 91, 99, 126, 131

[56] References Cited

U.S. PATENT DOCUMENTS 4,910,164  3/1990  Shichijo .................... 437/90
5,137,840  8/1992  Desilets et al. .................... 437/31

FOREIGN PATENT DOCUMENTS 0504875  9/1992  European Pat. Off. .

*Primary Examiner*—Tuan H. Nguyen
*Attorney, Agent, or Firm*—Young & Thompson

[57] ABSTRACT

A base region structure involved in a bipolar transistor, wherein the base region comprises a compound semiconductor epitaxial layer formed in a recessed portion provided by etching in an upper region of the semiconductor substrate and the recessed portion has a depth corresponding to a thickness of the compound semiconductor epitaxial layer so that the base region has a top surface positioned at the same level as a top surface of the semiconductor substrate.

6 Claims, 10 Drawing Sheets

METHOD FOR FABRICATING A BIPOLAR TRANSISTOR WITH A BASE LAYER HAVING AN EXTREMELY LOW RESISTANCE

BACKGROUND OF THE INVENTION

The invention relates to a bipolar transistor, and more particularly to a bipolar transistor with a base having an extremely low resistance and method for fabricating the same.

It has been known in the art, to which the invention pertains, that on of the most important factor associated with properties of a silicon bipolar transistor would be the noise figure which is represented by the following equation.

$$NF=1+r_b'/r_g+r_e/2r_g+((r_g+r_b'+r_e)^2/(2\alpha_o r_e r_g)) \, (f/1.2 f_T+1/h_{FE}+I_{cb}/I_E)$$

where $r_g$ is the impedance of signal source, $r_b'$ is the base resistance, $r_e$ is the emitter resistance and $\alpha_o$ is the coefficient of amplification at a high of the bipolar transistor when a base thereof is grounded.

From the above equation, it could be understood that when the base resistance $r_b'$ is reduced, then the noise figure is also reduced. To reduce the base resistance $r_b'$ it has been proposed to cause an impurity concentration $N_A$ of the base layer to increase. The silicon bipolar transistor, however, shows an increase of a base leak current when the impurity concentration $N_A$ of the base layer is increased more than $1\times10^{19}$ cm$^{-3}$.

To solve this problem, it has been proposed to use a SiGe amorphous base layer in place of the silicon base layer so that the impurity concentration of the SiGe amorphous base layer may be raised up to $1\times10^{20}$ cm$^{-3}$ with almost no base leak current, which is mentioned in the Japanese Laid-open Patent Application No. 3-76228. The conventional SiGe base bipolar transistor may be fabricated as follows.

With reference to FIG. 1A, field oxide films 14 are 14 are selectively formed on an n-type silicon substrate 13.

With reference to FIG. 1B, a silicon oxide film SiO₂ 15 is formed on an entire part of the substrate 13 and then a polysilicon film 16 is formed on an entire surface of the silicon oxide film 15. A p-type impurity such as boron is implanted into the polysilicon film 16.

With reference to FIG. 1C, an opening 17 is formed in the polysilicon film 16 and the silicon oxide film 15 to have a part of the silicon substrate expose thereby the remaining part of the polysilicon film 16 serves as a base plug layer 16a.

With reference to FIG. 1D, a p-type SiGe epitaxial base layer 18 is formed by a chemical vapor deposition method on the entire surface of the device.

With reference to FIG. 1E, an inter-layer insulator 19 is formed on an entire surface of the device.

With reference to FIG. 1F, an opening 20 is selectively formed in the inter-layer insulator 19 to cause a part of the surface of the p-type epitaxial base layer 18 to expose.

With reference to FIG. 1G, a polysilicon layer is formed on an entire surface of the device and then an n-type impurity such as phosphorus is implanted into the polysilicon layer for subsequent patterning of the polysilicon layer to have the n-doped polysilicon layer remain within the opening 20 and an upper part thereof so that the remaining n-doped polysilicon layer may serve as an emitter region 21 to thereby form an emitter/base junction. A contact hole is formed in the inter-layer insulator 19 wherein the contact hole is spaced apart from the emitter region 21. An aluminum film is formed on an entire surface of the device and thereafter the aluminium film is patterned to have the aluminium film remain on the emitter region 21 and within the contact hole to thereby form an emitter plug electrode 22 and a base wiring 23. The fabricated bipolar transistor has the p-type polysilicon layer with a base active part 24 which is in contact with the surface of the n-type silicon substrate 13.

The base active part 24 is electrically connected via the base plug layer 16a to the base wiring 23. The base plug layer 16a has a higher resistivity than a resistivity of the epitaxial base layer 18 including the base active layer 24, for which reason the base resistance depends substantially upon the resistance of the base plug layer 16a. This mean that any possible reduction in the resistance of the base active part 24 does not contribute to a substantial reduction of the base resistance of the bipolar transistor in so far as the resistance of the base plug layer 16 is not reduced. As illustrated in FIG. 1D, since the epitaxial base layer 18 is formed on the polysilicon layer 16a, the epitaxial base layer 18 positioned over the polysilicon layer 16a has a polycrystal structure rather than epitaxial structure. This may contribute to raise the base resistance of the bipolar transistor thereby resulting in a deterioration of the noise figure.

Another conventional bipolar transistor is disclosed in the Japanese Laid-open Patent Application No. 3-227023, which has a SiGe base layer without any base plug layer. This conventional bipolar transistor having no base plug layer is free from the above problem in deterioration of the noise figure. This conventional bipolar transistor may be fabricated as follows.

With reference to FIG. 2A, an n⁺-Si substrate 25 is prepared so that an n⁻-Si epitaxial layer 29 is formed on an entire surface of the substrate 25. Field oxide films 26 are selectively formed in the silicon epitaxial layer 29 by the local oxidation of silicon method so that the field oxide films 26 have bottoms which are positioned on the surface of the silicon substrate 25. An opening 28 is then formed over the silicon epitaxial layer 29 by a photo lithography for partial removal of the field oxide films but only positioned over the silicon epitaxial layer 29 thereby a surface of the device has a step-like discontinuity 36 in level between the field oxide film 26 and the silicon epitaxial layer 29.

With reference to FIG. 2B, p-SiGe amorphous layer 30 is formed on an entire surface of the device to cover the field oxide films 26 and the silicon epitaxial layer 29. An SiO₂ film 31 is formed on an entire surface of the SiGe amorphous layer 30.

With reference to FIG. 2C, the SiGe layer 30 and the SiO₂ film 31 are patterned by etching to remain within the opening 28 over the silicon epitaxial layer 29.

With reference to FIG. 2D, a silicon nitride film 32 is formed on an entire surface of the device to cover the patterned silicon oxide film 31 and the field oxide film 26.

With reference to FIG. 2E, openings respectively for emitter and base contacts are formed in the silicon nitride film 32 and the SiO₂ film 31 to have parts of the SiGe layer 30 exposed. An n-doped polysilicon film 33 is selectively formed in the opening for the emitter contact and in the vicinity thereof.

With reference to FIG. 2F, an emitter contact 34 is formed on the n-doped polysilicon film 33 as well as a base contact 35 is selectively formed in and vicinity of the base contact hole.

The above conventional bipolar transistor is engaged with the following problem.

As illustrated in FIG. 2A, the filed oxide film 26 extends on an edge of the silicon epitaxial layer 29 with the discontinuity in level between the field oxide film 26 and the silicon epitaxial layer 29. The SiGe amorphous layer 30 has an epitaxial growth part on the silicon epitaxial layer 29 and a polycrystal growth part on the field oxide film 26 wherein the epitaxial growth part is in contact with the polycrystal growth part, resulting in that the polycrystal part of the SiGe layer 30 is formed over the silicon epitaxial layer 29. This means that the SiGe base layer 30 may have a polycrystal growth part which contacts with the emitter polysilicon film 33. Accordingly, the emitter/base junction may be in the polycrystal structure thereby resulting in an increase in leakage current flowing across the emitter/base junction and in the unstability of an ohmic contact of the emitter/base junction.

Since the SiGe layer 30 is formed over the discontinuity 36 in level between the field oxide film 26 and the silicon epitaxial layer 29, the SiGe layer 30 also has a discontinuity in level. This may result in a lowering in accuracy of the subsequent photo lithography process. A thickness of the field oxide film 26 over the silicon epitaxial layer 29 or a height of the discontinuity 36 in level between the field oxide film 26 and the silicon epitaxial layer 29 is approximately 50 nanometers in consideration of the reduction in stress of the field oxide film 26 in its formation. This makes it difficult to allow the SiGe layer to have a large thickness for the reduction of the base resistance.

In the prior arts, to which the invention pertains, there is no technical idea for allowing the bipolar transistor to be free from the above disadvantages.

SUMMARY OF THE INVENTION

Accordingly, it is an object of the present invention to provide a novel bipolar transistor free from the problems as described above.

It is a further object of the present invention to provide a novel bipolar transistor with an extremely small base resistance.

It is a furthermore object of the present invention to provide a novel bipolar transistor possessing a reduced noise figure.

It is a still further object of the present invention to provide a novel bipolar transistor with a preferable emitter/base junction.

It is yet a further object of the present invention to provide a novel bipolar transistor having a high reliability in its performances.

It is another of the present invention to provide a novel method for fabricating a bipolar transistor free from the problems as described above.

It is still another object of the present invention to provide a novel method for fabricating a bipolar transistor with an extremely small base resistance.

It is yet another object of the present invention to provide a novel method for fabricating a bipolar transistor possessing a reduced noise figure.

It is moreover object of the present invention to provide a novel method for fabricating a bipolar transistor with a preferable emitter/base junction.

It is still more object of the present invention to provide a novel method for fabricating a bipolar transistor having a high reliability in its performances.

The above and other objects, features and advantages of the present invention will be apparent from the following descriptions.

The present invention provides a base region structure involved in a bipolar transistor, wherein the base region comprises a compound semiconductor epitaxial layer formed in a recessed portion provided by etching in an upper region of the semiconductor substrate and the recessed portion has a depth corresponding to a thickness of the compound semiconductor epitaxial layer so that the base region has a top surface positioned at the same level as a top surface of the semiconductor substrate.

The present invention also provides a bipolar transistor comprising: a semiconductor substrate serving as a collector region; field oxide films formed in an upper region of the semiconductor substrate to define an active region which acts as the collector region; a base region comprising a compound semiconductor epitaxial layer formed in a recessed portion provided by etching in an upper region of the semiconductor substrate and the recessed portion having a depth corresponding to a thickness of the compound semiconductor epitaxial layer so that the base region has a top surface positioned at the same level as a top surface of the semiconductor substrate; and an emitter region formed in an upper region of the base region.

In the above novel bipolar transistor, a silicon oxide film is formed to cover the base region, the top surface of the substrate and the field oxide films, the silicon oxide film having an emitter contact hole and at least a base contact hole. A silicon nitride film is formed on the silicon oxide film, the silicon nitride film having an emitter contact hole and at least a base contact holes positioned just over the emitter and base contact holes of the silicon oxide film. A polysilicon layer is formed in the emitter contact hole to project over the the nitride film. An emitter electrode is provided on the polysilicon layer so that the emitter electrode is electrically connected via the polysilicon layer to the emitter region. At least a base electrode is formed in the at least one base contact hole.

The present invention also provides a method for forming a base region of a bipolar transistor comprising the following steps. A recessed portion having a predetermined depth is selectively formed in an upper region of a semiconductor substrate acting as a collector region expect for field oxide films selectively formed in the semiconductor substrate. A base region which comprises a compound semiconductor epitaxial layer is selectively formed in the recessed portion and the compound semiconductor epitaxial layer having a thickness corresponding to the depth of the recessed portion formed in the semiconductor substrate so that the base region has a top surface positioned at the same level as a top surface of the semiconductor substrate. The recessed portion may be formed by etching with use of a silicon nitride film pattern as a mask. The base region comprising the compound semiconductor epitaxial layer may be formed by the following steps. A compound semiconductor layer is deposited on an entire surface of the substrate so that a compound semiconductor epitaxial layer is grown in the recessed portion and a compound semiconductor polycrystal layer is grown on the silicon nitride film. Both the compound semiconductor polycrystal layer and the silicon nitride film are removed so that the compound semiconductor epitaxial layer remains within the recessed portion.

Alternatively, the recessed portion is formed by etching with use of silicon oxide films formed field oxide films as masks where the field oxide films extend over edges of the upper portions of the semiconductor substrate. The base region comprising the compound semiconductor epitaxial layer may be formed by the following steps. A compound semiconductor layer is deposited on an entire surface of the substrate so that a compound semiconductor epitaxial layer is grown in the recessed portion and a compound semiconductor polycrystal layer is grown on the silicon oxide film. The compound semiconductor polycrystal layer is removed so that the compound semiconductor epitaxial layer remains within the recessed portion. The compound semiconductor layer is a SiGe layer.

Alternatively, the base region comprising the compound semiconductor epitaxial layer may be formed by the following steps. A SiGe layer is deposited on an entire surface of the substrate so that a SiGe epitaxial layer is grown in the recessed portion and a SiGe polycrystal layer is grown on the silicon oxide film. A silicon layer is formed on an entire surface of the substrate so that a silicon epitaxial layer is grown on the SiGe epitaxial layer and a polysilicon layer is grown on the silicon oxide film. The SiGe polycrystal layer and the polysilicon layer are removed so that the compound semiconductor epitaxial layer remains within the recessed portion.

BRIEF DESCRIPTIONS OF THE DRAWINGS

Preferred embodiments of the present invention will be described in detail with reference to the accompanying drawings.

PREFERRED EMBODIMENTS OF THE PRESENT INVENTION

A first embodiment according to the present invention will be described in detail with reference to FIGS. 3 and 4A to 4J in which a novel bipolar transistor is provided.

Figure 1A:
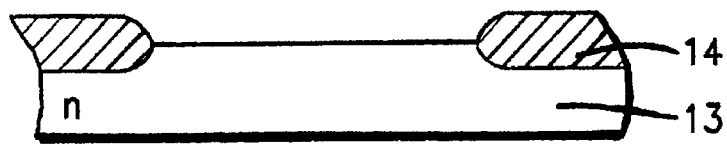
FIGS. 1A to 1G are fragmentary cross sectional elevation views illustrative of the conventional bipolar transistor in sequential processes involved in the conventional fabrication method thereof.
Figure 1B:
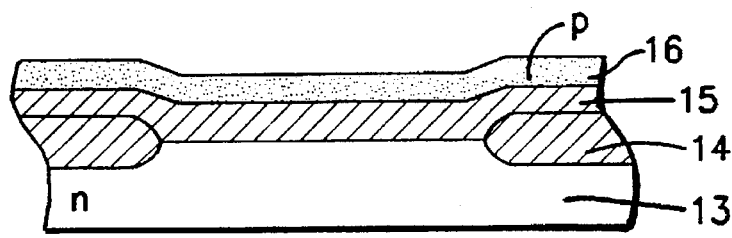
Figure 1C:
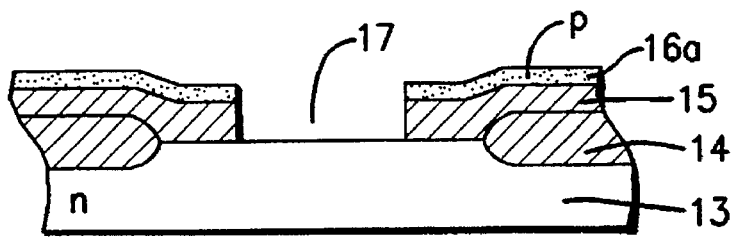
Figure 1D:
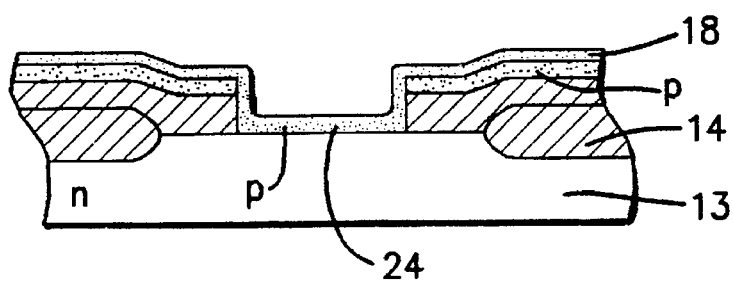
Figure 1E:
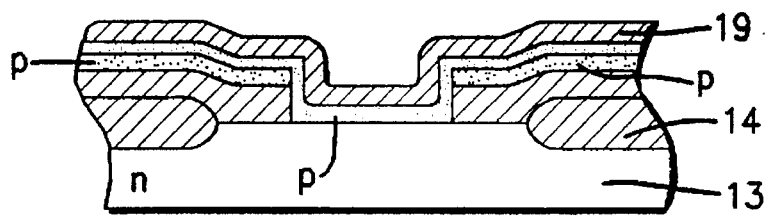
Figure 1F:
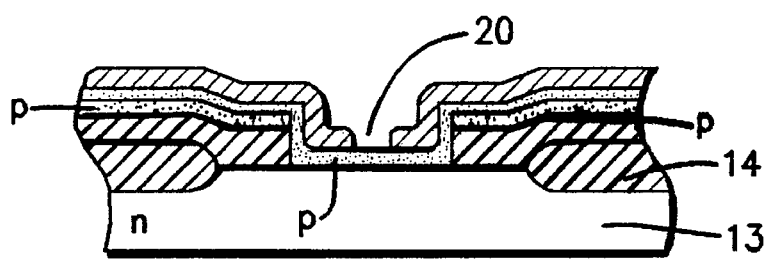
Figure 1G:
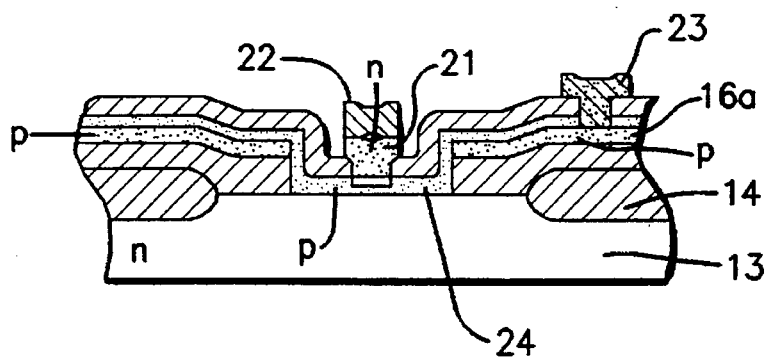
Figure 2A:
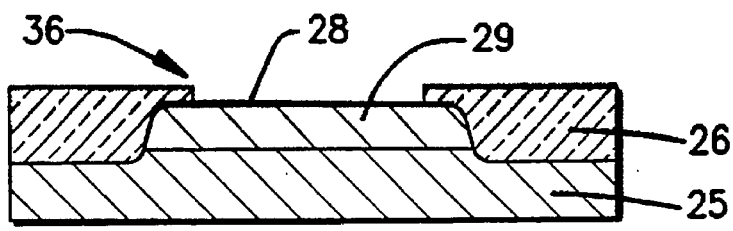
FIGS. 2A to 2F are fragmentary cross sectional elevation views illustrative of the conventional bipolar transistor in sequential processes involved in the conventional fabrication method thereof.
Figure 2B:
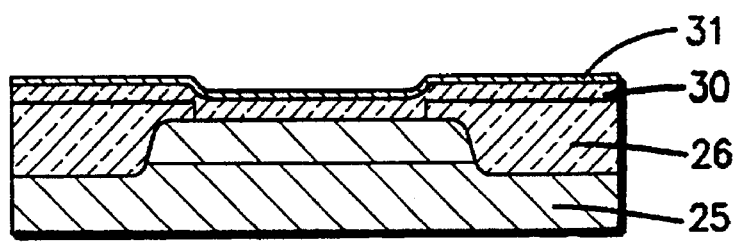
Figure 2C:
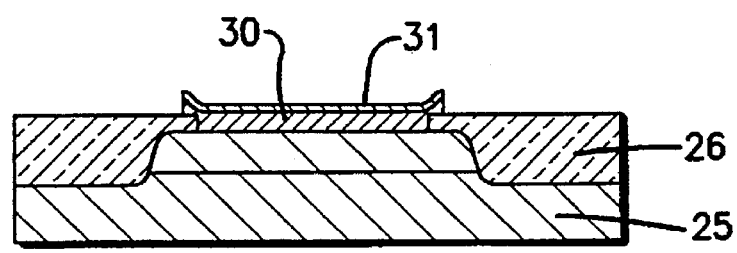
Figure 2D:
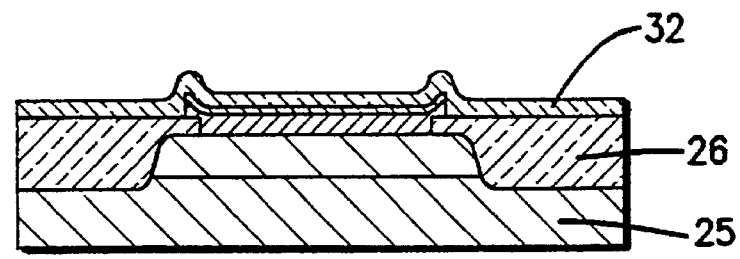
Figure 2E:
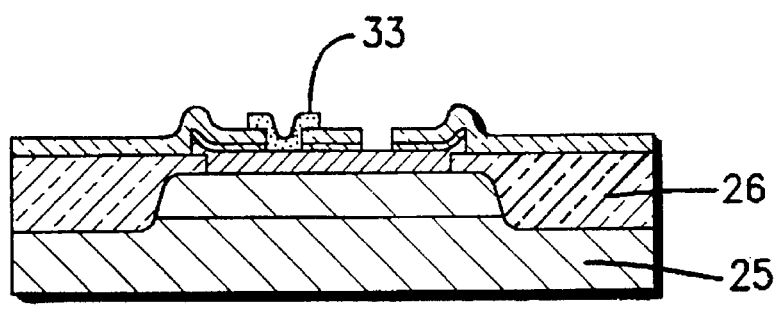
Figure 2F:
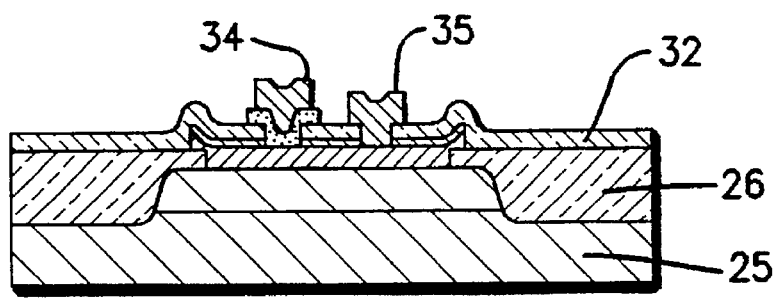
Figure 3:
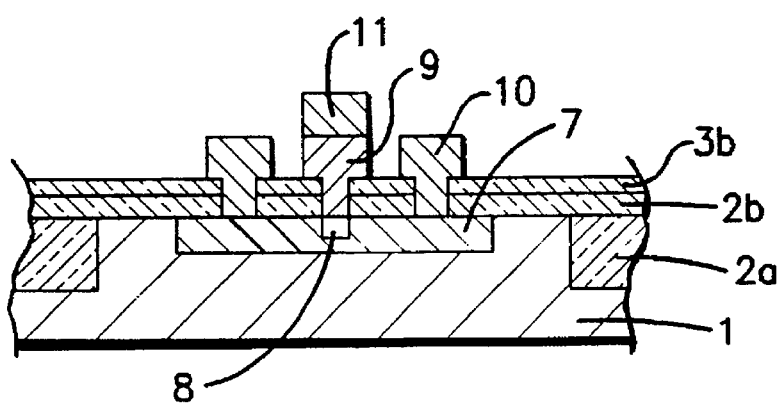
FIG. 3 is a fragmentary cross sectional elevation view illustrative of a novel bipolar transistor in a fist embodiment according to the present invention.

A novel bipolar transistor according to the present invention will be described with reference to FIG. 3. An n-doped silicon substrate 1 is electrically isolated by field oxide films 2a to define an active region which may perform as a collector region. A top surface of the field oxide films 2a is positioned at the same level as a level of a top surface of the silicon substrate 1. The collector region has a top surface with discontinuity in level of the surface. In a surface region of the collector region comprising part of the silicon substrate 1, an epitaxial base layer 7 acting as a base region is formed to be spaced apart from edges of the field oxide films 2a. An emitter region 8 doped with arsenic is formed in an upper part of the epitaxial base layer 7. A polysilicon layer 9 doped with arsenic is provided on the emitter region 8. The emitter region 8 may be formed by a thermal diffusion of arsenic from the polysilicon layer 9 into the predetermined upper part of the base region 7. The collector region 1, the base region 8 and the emitter region 9 as well as the field oxide films 2a have the same to level as illustrated in FIG. 3. A silicon oxide film or a $SiO_2$ film 3b is formed on an entire surface of the device to cover the field oxide films 2a, the top portion of the silicon substrate 1, the base region 7 and the emitter region 8 and subsequently a silicon nitride film 3b is formed on an entire surface of the silicon oxide film 2b. Base contact holes are formed in the silicon oxide film 2b and the silicon nitride film 3b to expose both a part of the base region 7 and the emitter region 8. Base electrodes 10 are formed within the base contact hole to have the base electrode contact with the base region 7. The polysilicon layer 9 also penetrates the silicon oxide film 2b and the silicon nitride film 3b to be in contact with the emitter region 8. An emitter electrode 11 is provided on the polysilicon layer 9 so that the emitter electrode 11 is electrically connected via the polysilicon layer 8 to the emitter region 8.

The above described bipolar transistor has the SiGe base region 7 which is formed in a recess portion provided in the predetermined upper portion of the silicon substrate 1 to allow that the top of the epitaxial base region 7 is positioned at the same level as the top of the silicon substrate 1 acting as the collector region. This may permit for setting a thickness of the epitaxial base layer 7 regardless from any layers such as field oxide films 2a.

Figure 4A:
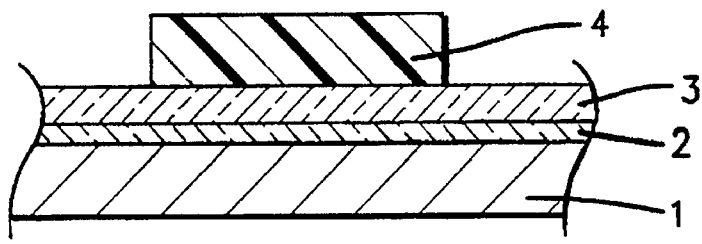
FIGS. 4A to 4J are fragmentary cross sectional elevation views illustrative of a novel bipolar transistor in sequential processes involved in a novel fabrication method thereof in a first embodiment according to the present invention.

The novel bipolar transistor may be fabricated as follows. With reference to FIG. 4A, an n-doped silicon substrate 1 is prepared so that the n-doped silicon substrate 1 is subjected to a non-selective thermal oxidation to thereby form a silicon oxide film 2 or a $SiO_2$ film having a thickness approximately 50 nanometers on a top surface of the silicon substrate 1. A silicon nitride film 3 or a SiN film is formed on an entire surface of the silicon oxide film 2 by a low pressure chemical vapor deposition method wherein the silicon nitride film 3 has a thickness of 150 nanometers. A photo resist 4 is applied on the silicon nitride film 3 for subsequent photo-lithograph process to partially remove the photo resist 4 thereby the remaining part of the photo resist 4 is positioned in a predetermined region within which a base region will be formed later.

Figure 4B:
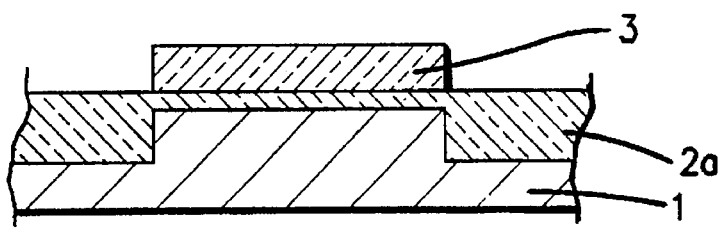

With reference to FIG. 4B, the silicon nitride film 3 is patterned by use of the remaining part of the photo resist film 4 as a mask so that the silicon nitride film 3 is partially removed to remain just over the predetermined region within which a base region will be formed later. The photo resist film 4 is removed for subsequent high pressure thermal oxidation of the silicon oxide film 2 which is not covered by the remaining silicon nitride film 3 so that field oxide films 2a are formed except for the predetermined region within which a base region is formed later.

Figure 4C:
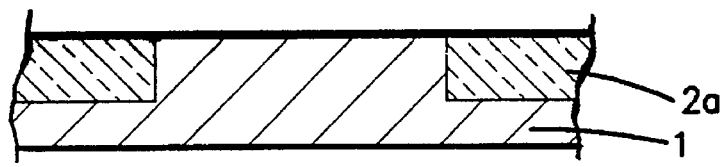
Figure 4D:
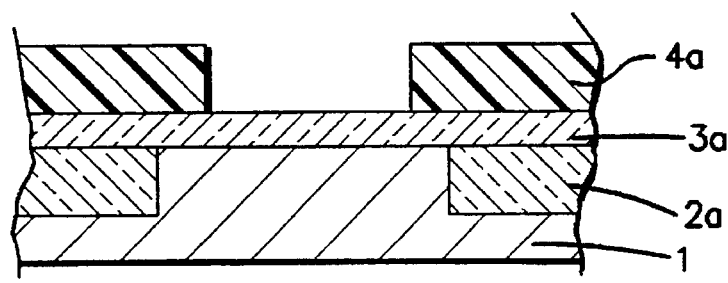

With reference to FIG. 4C, the silicon nitride film 4B is removed by a phosphoric acid at a temperature of 150° C. An etching liquid or an etchant of ammonium fluoride:fluorine acid:water=6:1:20 is used to remove the silicon oxide film to have the top surface of the silicon substrate 1 exposed but the field oxide films 2a remain wherein the top surface of the silicon substrate 1 is positioned at the same level as the top level of the field oxide films 2a.

with reference to FIG. 4D, the silicon nitride film 3a having a thickness of 150 nanometers is formed on an entire surface of the device to cover the top surface of the silicon substrate 1 and the field oxide films 2a. A photo resist 4a is applied on the silicon nitride film 3a and then patterned by a photo-lithography process to form an opening over a base region.

Figure 4E:
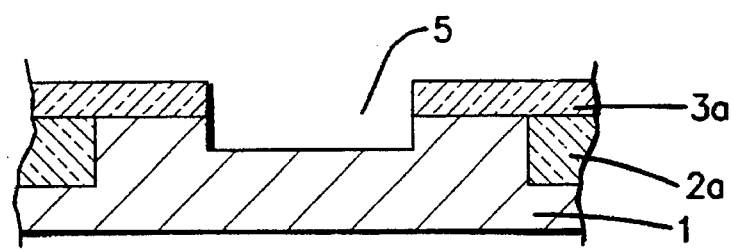

With reference to FIG. 4E, the silicon nitride film 3a is patterned by a reactive ion etching method using gases mainly containing CF$_4$ with use of the photo-resist 4a as a mask. The photo-resist 4a is removed. The silicon substrate 1 is partially removed by a reactive etching using gases mainly containing a chlorine gas so that a recess portion 5 having a depth of 100 nanometers is formed in an upper region of the silicon substrate 1. The recess portion 5 corresponds to the base region which will be formed later. Subsequently, the recessed portion 5 formed in the predetermined upper surface of the silicon substrate 1 is subjected to an additional etching using an etching liquid as an etchant of water:fluorine acid=50:1 for ten seconds. The etchant may alternatively be an etching liquid containing fluorine acid, an ice acetic acid, iodine and water to remove a surface part of the recessed portion 5 which has a crystal imperfection due to the reactive ion etching.

Figure 4F:
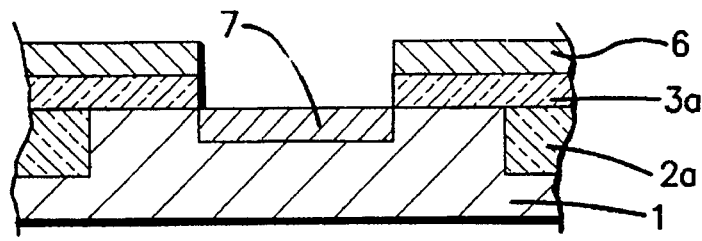

With reference to FIG. 4F, a SiGe amorphous layer having a thickness of 100 nanometers is formed on an entire surface of the device by use of molecular beam epitaxy method. The thickness of the SiGe amorphous layer just corresponds to the depth of the recessed portion 5 formed in the predetermined upper region of the silicon substrate 1 so that the SiGe amorphous layer is formed within the recessed portion on the silicon substrate 1 and on the silicon nitride film, wherein on the silicon nitride film 3a the SiGe amorphous film shows a polycrystal growth while within the recessed portion on the silicon substrate 1 the SiGe amorphous layer may show an epitaxial growth. As a result, the epitaxial base layer 7 is formed within the recessed portion 7 while the polycrystal SiGe layer 6 is formed on the silicon nitride film 3a. Since the thickness of the epitaxial base layer 7 corresponds to the depth of the recessed portion 5, the top level of the epitaxial base layer 7 corresponds to the top levels of the silicon substrate 1 and the field oxide films 2a. As a gas source for the moleculare beam epitaxy method, either gas sources or solid source is available.

Figure 4G:
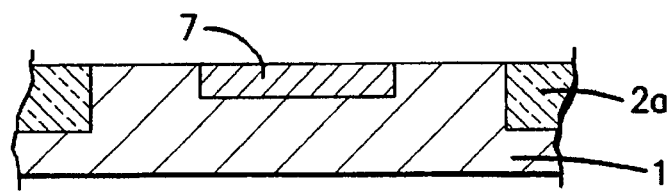

With reference to FIG. 4G, the polycrystal SiGe layer 6 and the silicon nitride film 3a are removed.

Figure 4H:
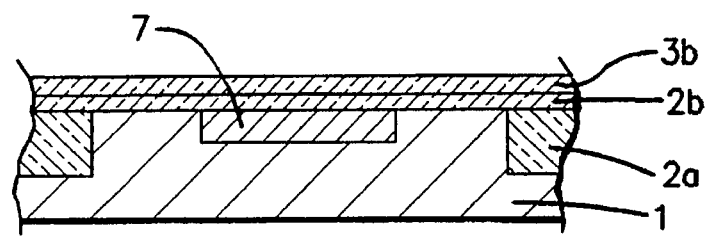

With reference to FIG. 4H, a silicon oxide film 2b having a thickness of 50 nanometers is formed by a low pressure chemical vapor deposition on an entire surface of the device to cover the SiGe epitaxial base layer 7 and the top surface of the silicon substrate 1 as well as the field oxide films 2a. A silicon nitride film 3b having a thickness of 150 nanometers is formed on an enitre surface of the silicon oxide film 2b by the low pressure chemical vapor deposition.

Figure 4I:
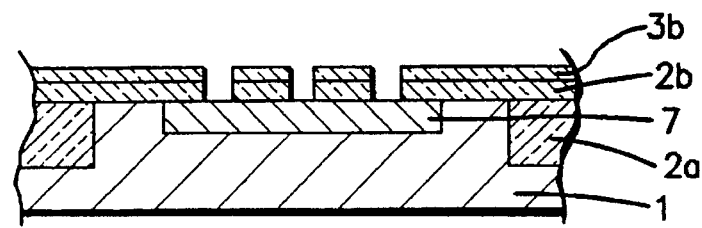

With reference to FIG. 4I, emitter and base contact holes are selectively formed in the silicon oxide film 2b and the silicon nitride film 3b to have parts of the SiGe epitaxial base layer exposed.

Figure 4J:
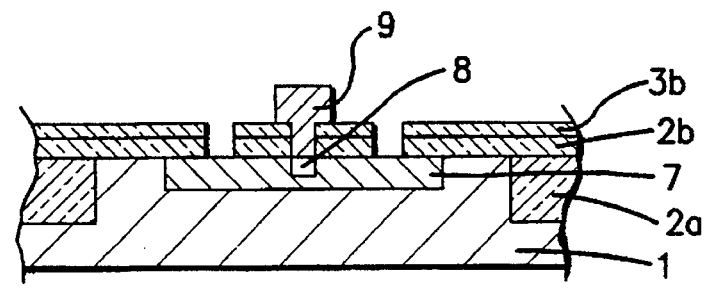

With reference to FIG. 4J, an As-doped polysilicon layer 9 is formed in the emitter contact. The As-doped polysilicon layer 9 is subjected to a thermal diffusion for diffusing As atoms from the As-doped polysilicon layer 9 into the exposed surface of the SiGe epitaxial base layer 7 thereby an As diffusion region serving as an emitter region 8 is formed in the upper surface of the SiGe epitaxial base layer just under the As-doped polysilicon layer 9. An emitter electrode not illustrated is formed on the As-doped polysilicon layer 9 so that the emitter electrode is electrically connected via the As-doped polysilicon layer to the emitter region 8. Base electrodes not illustrated are formed in the base contact holes so that the base electrodes are electrically connected to the SiGe epitaxial base region 7 thereby resulting in the completion of the bipolar transistor.

As could be seen from the above description, the thickness of the SiGe epitaxial base layer 7 may readily be varied only by changing the depth of the recessed portion 5. This may permit the SiGe epitaxial base layer to have a sufficiently large thickness by forming the recessed portion 5 having a large depth. The increase in the thickness of the SiGe epitaxial base layer 7 by increase in the depth of the recessed portion 5 may reduce a resistance of the SiGe epitaxial base layer 7.

The above novel bipolar transistor has a double base structure with a peripheral length 41.2 micrometers of the emitter region. It was confirmed that the base resistance of the novel bipolar transistor $r_b'$=0.3 ohms per an emitter electrode. The bipolar transistor with six emitters has a base resistance of 0.05 ohms and the noise figure NF=0.2 dB as well as shows a frequency f=2 GHz and also a collector current being a current when the noise figure NF is minimum, namely $\Gamma=\Gamma_{out}$. The noise figure is as low as GaAs heterojunction field effect transistor.

A second embodiment according to the present invention will be described in which a novel bipolar transistor having he same structure but fabricated by a different process is provided, for which reason the descriptions as to the structure of the novel bipolar transistor of the second embodiment will be the same as that of the first embodiment described above and illustrated in FIG. 3. Namely, an n-doped silicon substrate 1 is electrically isolated by field oxide films 2a to define an active region which may perform as a collector region. A top surface of the field oxide films 2a is positioned at the same level as a level of a top surface of the silicon substrate 1. The collector region has a top surface with discontinuity in level of the surface. In a surface region of the collector region comprising part of the silicon substrate 1, an epitaxial base layer 7 acting as a base region is formed to be spaced apart from edges of the field oxide films 2a. An emitter region 8 doped with arsenic is formed in an upper part of the epitaxial base layer 7. A polysilicon layer 9 doped with arsenic is provided on the emitter region 8. The emitter region 8 may be formed by a thermal diffusion of arsenic from the polysilicon layer 9 into the predetermined upper part of the base region 7. The collector region 1, the base region 8 and the emitter region 9 as well as the field oxide films 2a have the same to level as illustrated in FIG. 3. A silicon oxide film or a SiO$_2$ film 3b is formed on an entire surface of the device to cover the field oxide films 2a, the top portion of the silicon substrate 1, the base region 7 and the emitter region 8 and subsequently a silicon nitride film 3b is formed on an entire surface of the silicon oxide film 2b. Base contact holes are formed in the silicon oxide film 2b and the silicon nitride film 3b to expose both a part of the base region 7 and the emitter region 8. Base electrodes 10 are formed within the base contact hole to have the base electrode contact with the base region 7. The polysilicon layer 9 also penetrates the silicon oxide film 2b and the silicon nitride film 3b to be in contact with the emitter region 8. An emitter electrode 11 is provided on the polysilicon layer 9 so that the emitter electrode 11 is electrically connected via the polysilicon layer 8 to the emitter region 8.

The above described bipolar transistor has the SiGe base region 7 which is formed in a recess portion provided in the predetermined upper portion of the silicon substrate 1 to allow that the top of the epitaxial base region 7 is positioned at the same level as the top of the silicon substrate 1 acting as the collector region. This may permit for setting a thickness of the epitaxial base layer 7 regardless from any layers such as field oxide films 2a. Initial processes for fabricating the novel bipolar transistor of the second embodiment are the same as those of the first embodiment.

Figure 5A:
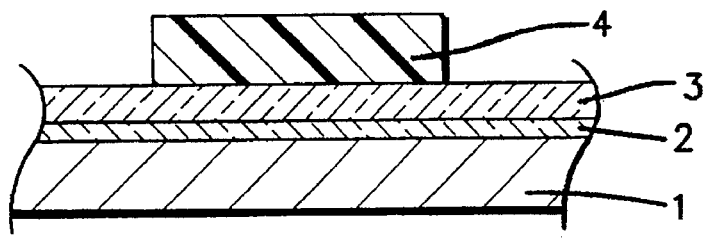
FIGS. 5A to 5J are fragmentary cross sectional elevation views illustrative of a novel bipolar transistor in sequential processes involved in a novel fabrication method thereof in a second embodiment according to the present invention.

With reference to FIG. 5A, an n-doped silicon substrate 1 is prepared so that the n-doped silicon substrate 1 is subjected to a non-selective thermal oxidation to thereby form a silicon oxide film 2 or a $SiO_2$ film having a thickness approximately 50 nanometers on a top surface of the silicon substrate 1. A silicon nitride film 3 or a SiN film is formed on an entire surface of the silicon oxide film 2 by a low pressure chemical vapor deposition method wherein the silicon nitride film 3 has a thickness of 150 nanometers. A photo resist 4 is applied on the silicon nitride film 3 for subsequent photo-lithograph process to partially remove the photo resist 4 thereby the remaining part of the photo resist 4 is positioned in a predetermined region within which a base region will be formed later.

Figure 5B:
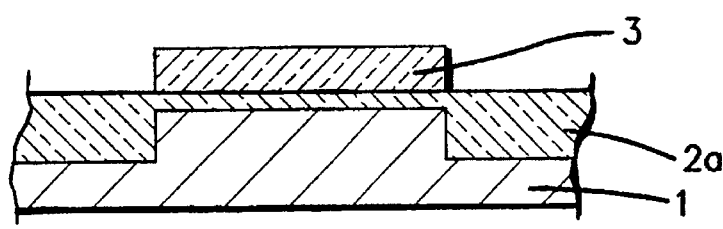

With reference to FIG. 5B, the silicon nitride film 3 is patterned by use of the remaining part of the photo resist film 4 as a mask so that the silicon nitride film 3 is partially removed to remain just over the predetermined region within which a base region will be formed later. The photo resist film 4 is removed for subsequent high pressure thermal oxidation of the silicon oxide film 2 which is not covered by the remaining silicon nitride film 3 so that field oxide films 2a are formed except for the predetermined region within which a base region is formed later.

Figure 5C:
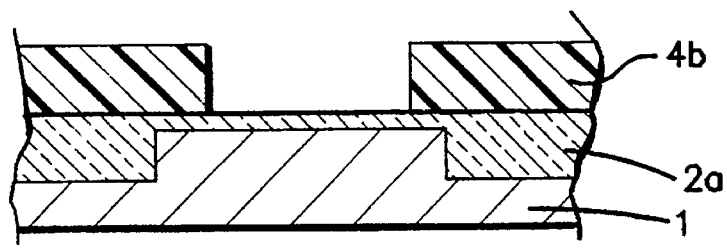

With reference to FIG. 5C, the remaining part of the silicon nitride film 3 is removed. A photo resist film 4b is applied on an entire surface of of the field oxide film 2a. The photo resist film 4b is patterned to form an opening on a predetermined region over the convex portion of the silicon substrate 1 so that a part of the field oxide film 2a positioned over the convex portion of the silicon substrate 1. The opening of the photo resist film is positioned just on a predetermined region on which an SiGe epitaxial base region will be fabricated later.

Figure 5D:
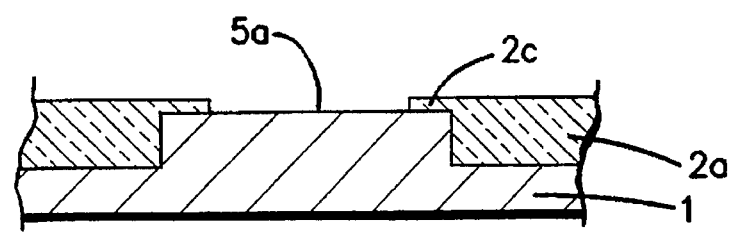

With reference to FIG. 5D, the silicon oxide film over the convex portion of the silicon substrate 1 is removed by etching using the photo-resist film 4b so that the thin silicon oxide film just under the opening of the photo resist film 4b is removed to have the top surface of the convex portion of the silicon substrate 1 exposed, wherein parts of the thin silicon oxide film remains on edges of the convex portion of the silicon substrate 1. The edges of the thin silicon oxide film 3c defines an opening 5a through which the surface of the convex portion of the silicon substrate 1 is exposed. The photo resist film 4b is thereafter removed.

Figure 5E:
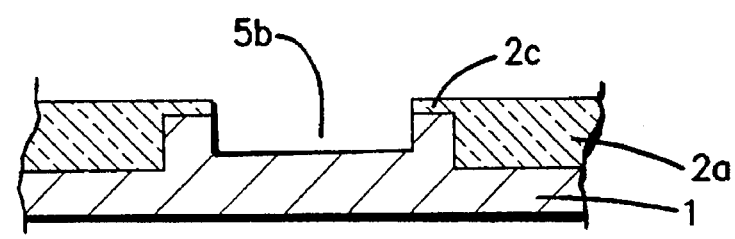

With reference to FIG. 5E, the exposed surface of the convex portion of the silicon substrate 1 via the opening 5a is removed by a selective etching using the remaining silicon oxide thin film 2c as a mask so that a recessed portion 5b having a predetermined depth which corresponds to an intended thickness of a base layer to be formed later is formed in an upper region of the convex portion of the silicon substrate 1.

Figure 5F:
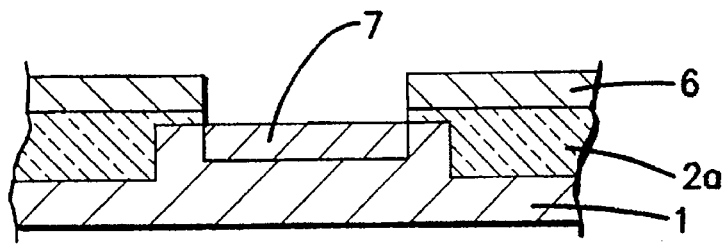

With reference to FIG. 5F, a SiGe amorphous layer having a thickness corresponds to the depth of the recessed portion 5b is formed on an entire surface of the device by use of molecular beam epitaxy method. The thickness of the SiGe amorphous layer just corresponds to the depth of the recessed portion 5 formed in the predetermined upper region of the silicon substrate 1 so that the SiGe amorphous layer is formed within the recessed portion on the silicon substrate 1 and on the silicon oxide film, wherein on the silicon oxide film 2a the SiGe amorphous film shows a polycrystal growth while within the recessed portion 5b on the silicon substrate 1 the SiGe amorphous layer may show an epitaxial growth. As a result, the epitaxial base layer 7 is formed within the recessed portion 7 while the polycrystal SiGe layer 6 is formed on the silicon nitride film 3a. Since the thickness of the epitaxial base layer 7 corresponds to the depth of the recessed portion 5, the top level of the epitaxial base layer 7 corresponds to the top levels of the silicon substrate 1 and the field oxide films 2a. As a gas source for the moleculare beam epitaxy method, either gas sources or solid source is available.

Figure 5G:
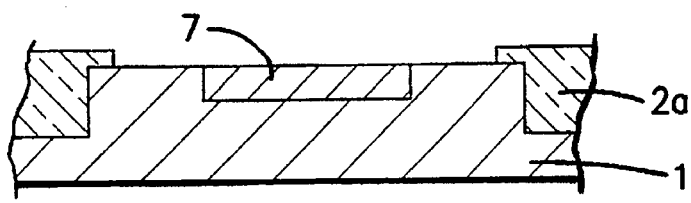

With reference to FIG. 5G, the polycrystal SiGe layer 6 and the silicon oxide film 2a are removed.

Figure 5H:
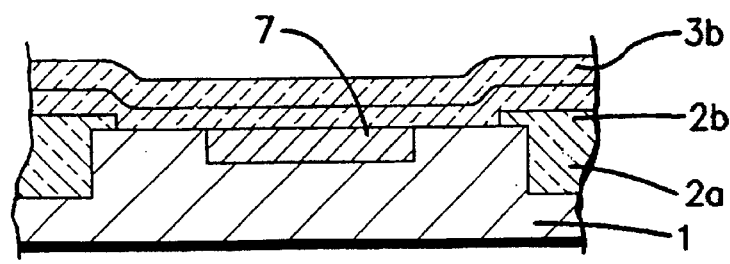

With reference to FIG. 5H, a silicon oxide film 2b having a thickness of 50 nanometers is formed by a low pressure chemical vapor deposition on an entire surface of the device to cover the SiGe epitaxial base layer 7 and the top surface of the silicon substrate 1 as well as the field oxide films 2a. A silicon nitride film 3b having a thickness of 150 nanometers is formed on an enitre surface of the silicon oxide film 2b by the low pressure chemical vapor deposition.

Figure 5I:
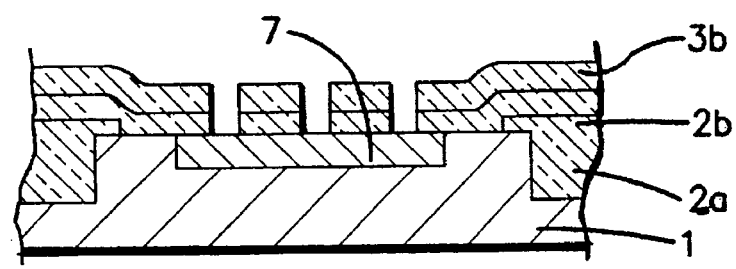

With reference to FIG. 5I, emitter and base contact holes are selectively formed in the silicon oxide film 2b and the silicon nitride film 3b to have parts of the SiGe epitaxial base layer exposed.

Figure 5J:
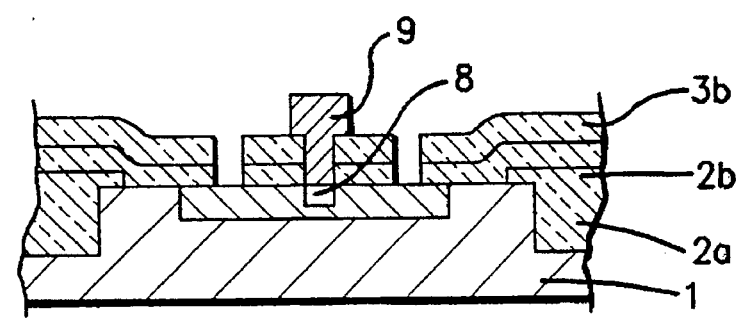

With reference to FIG. 5J, an As-doped polysilicon layer 9 is formed in the emitter contact. The As-doped polysilicon layer 9 is subjected to a thermal diffusion for diffusing As atoms from the As-doped polysilicon layer 9 into the exposed surface of the SiGe epitaxial base layer 7 thereby an As-diffusion region serving as an emitter region 8 is formed in the upper surface of the SiGe epitaxial base layer just under the As-doped polysilicon layer 9. An emitter electrode not illustrated is formed on the As-doped polysilicon layer 9 so that the emitter electrode is electrically connected via the AS-doped polysilicon layer to the emitter region 8. Base electrodes not illustrated are formed in the base contact holes so that the base electrodes are electrically connected to the SiGe epitaxial base region 7 thereby resulting in the completion of the bipolar transistor.

As could be seen from the above description, the thickness of the SiGe epitaxial base layer 7 may readily be varied only by changing the depth of the recessed portion 5. This may permit the SiGe epitaxial base layer to have a sufficiently large thickness by forming the recessed portion 5 having a large depth. The increase in the thickness of the SiGe epitaxial base layer 7 by increase in the depth of the recessed portion 5 may reduce a resistance of the SiGe epitaxial base layer 7.

No silicon nitride film is used in etching the silicon substrate 1 to form the recessed portion in the upper region of the silicon substrate 1. This may result in shortening of the fabrication processes.

The above novel bipolar transistor has a double base structure with a peripheral length 41.2 micrometers of the emitter region. It was confirmed that the base resistance of the novel bipolar transistor $r_b'$=0.3 ohms per an emitter electrode. The bipolar transistor with six emitters has a base resistance of 0.05 ohms and the noise figure NF=0.2 dB as well as shows a frequency f=2 GHz and also a collector current being a current when the noise figure NF is minimum, namely $\Gamma=\Gamma_{out}$. The noise figure is as low as GaAs heterojunction field effect transistor.

As a modification, a combination of both the fabrication methods of the first and second embodiment is also available. Namely, a silicon nitride film is further formed on the silicon oxide film so that the combination of the silicon oxide film and the additional silicon nitride film is used as a mask. The use of the silicon nitride film as a mask for etching process may permit a lager selective ratio of etching to the silicon substrate 1. This may permit forming a deeper recessed portion to thereby allow a SiGe epitaxial base layer having a larger thickness to be formed within the deeper recessed portion. The larger thickness of the SiGe epitaxial base layer may reduce a resistance thereof. The reduction in the thickness of the SiGe epitaxial base layer may permit the bipolar transistor free from the deterioration of the noise figure.

The silicon oxide film provided between the silicon substrate and the silicon nitride film, wherein both the silicon oxide film and the silicon nitride film are used as masks, may act as a buffer layer which may provides a relaxation of a stress between the silicon nitride film and the silicon substrate.

As a further modification, the mask used for etching the predetermined upper portion of the silicon substrate may be a photo resist in place of the silicon oxide film and the silicon nitride film.

Figure 6A:
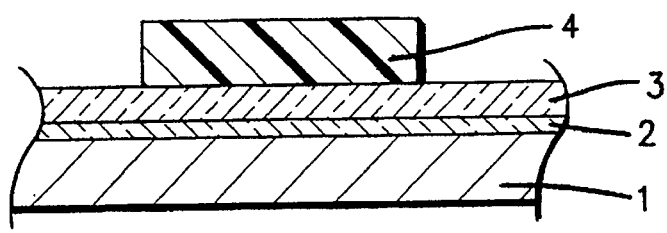
FIGS. 6A to 6K are fragmentary cross sectional elevation views illustrative of a novel bipolar transistor in sequential processes involved in a novel fabrication method thereof in a third embodiment according to the present invention.

A third embodiment according to the present invention will be described as follows. With reference to FIG. 6A, an n-doped silicon substrate 1 is prepared so that the n-doped silicon substrate 1 is subjected to a non-selective thermal oxidation to thereby form a silicon oxide film 2 or a Sio$_2$ film having a thickness approximately 50 nanometers on a top surface of the silicon substrate 1. A silicon nitride film 3 or a SiN film is formed on an entire surface of the silicon oxide film 2 by a low pressure chemical vapor deposition method wherein the silicon nitride film 3 has a thickness of 150 nanometers. A photo resist 4 is applied on the silicon nitride film 3 for subsequent photo-lithograph process to partially remove the photo resist 4 thereby the remaining part of the photo resist 4 is positioned in a predetermined region within which a base region will be formed later.

Figure 6B:
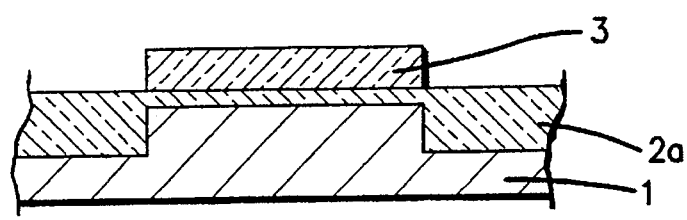

With reference to FIG. 6B, the silicon nitride film 3 is patterned by use of the remaining part of the photo resist film 4 as a mask so that the silicon nitride film 3 is partially removed to remain just over the predetermined region within which a base region will be formed later. The photo resist film 4 is removed for subsequent high pressure thermal oxidation of the silicon oxide film 2 which is not covered by the remaining silicon nitride film 3 so that field oxide films 2a are formed except for the predetermined region within which a base region is formed later.

Figure 6C:
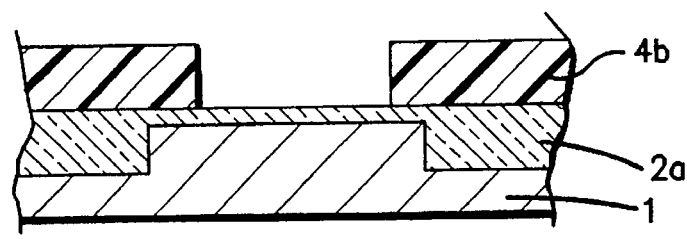

With reference to FIG. 6C, the remaining part of the silicon nitride film 3 is removed. A photo resist film 4b is applied on an entire surface of of the field oxide film 2a. The photo resist film 4b is patterned to form an opening on a predetermined region over the convex portion of the silicon substrate 1 so that a part of the field oxide film 2a positioned over the convex portion of the silicon substrate 1. The opening of the photo resist film is positioned just on a predetermined region on which an SiGe epitaxial base region will be fabricated later.

Figure 6D:
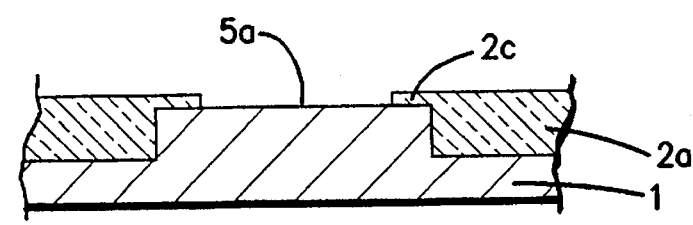

With reference to FIG. 6D, the silicon oxide film over the convex portion of the silicon substrate 1 is removed by etching using the photo-resist film 4b so that the thin silicon oxide film just under the opening of the photo resist film 4b is removed to have the top surface of the convex portion of the silicon substrate 1 exposed, wherein parts of the thin silicon oxide film remains on edges of the convex portion of the silicon substrate 1. The edges of the thin silicon oxide film 3c defines an opening 5a through which the surface of the convex portion of the silicon substrate 1 is exposed. The photo resist film 4b is thereafter removed.

Figure 6E:
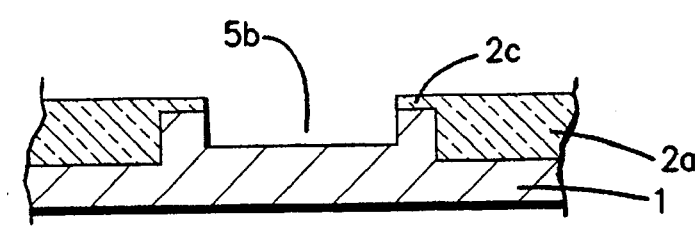

With reference to FIG. 6E, the exposed surface of the convex portion of the silicon substrate 1 via the opening 5a is removed by a selective etching using the remaining silicon oxide thin film 2c as a mask so that a recessed portion 5b having a predetermined depth which corresponds to an intended thickness of a base layer to be formed later is formed in an upper region of the convex portion of the silicon substrate 1.

Figure 6F:
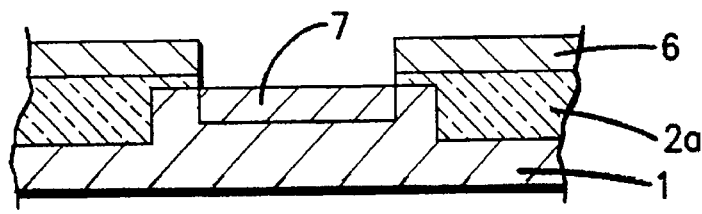

With reference to FIG. 6F, a SiGe amorphous layer having a thickness corresponds to the depth of the recessed portion 5b is formed on an entire surface of the device by use of molecular beam epitaxy method. The thickness of the SiGe amorphous layer just corresponds to the depth of the recessed portion 5 formed in the predetermined upper region of the silicon substrate 1 so that the SiGe amorphous layer is formed within the recessed portion on the silicon substrate 1 and on the silicon oxide film, wherein on the silicon oxide film 2a the SiGe amorphous film shows a polycrytal growth while within the recessed portion 5b on the silicon substrate 1 the SiGe amorphous layer may show an epitaxial growth. As a result, the epitaxial base layer 7 is formed within the recessed portion 7 while the polycrystal SiGe layer 6 is formed on the silicon nitride film 3a. Since the thickness of the epitaxial base layer 7 corresponds to the depth of the recessed portion 5, the top level of the epitaxial base layer 7 corresponds to the top levels of the silicon substrate 1 and the field oxide films 2a. As a gas source for the moleculare beam epitaxy method, either gas sources or solid source is available.

Figure 6G:
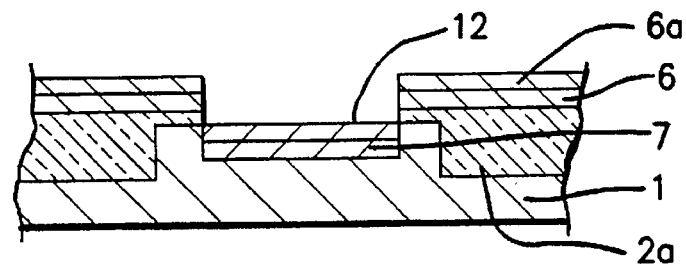

With reference to FIG. 6G, a silicon layer is formed on an entire surface of the device so that the silicon layer on the SiGe epitaxial base layer 7 shows an epitaxial growth thereby a silicon epitaxial layer 12 is formed on the SiGe epitaxial base layer 7, while the silicon layer on the SiGe polycrystal layer 6 shows a polycrystal growth thereby a polysilicon layer 6a is formed on he SiGe polycrystal layer 6.

Figure 6H:
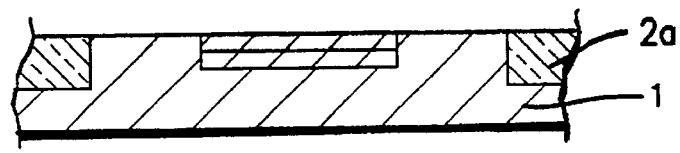
Figure 6I:
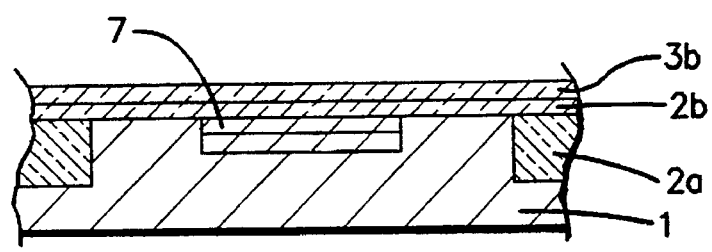

With reference to FIG. 6H, the polycrystal SiGe layer 6 and the polysilicon layer 6a are removed.

with reference to FIG. 6I, a silicon oxide film 2b having a thickness of 50 nanometers is formed by a low pressure chemical vapor deposition on an entire surface of the device to cover the Si epitaxial layer 12 and the top surface of the silicon substrate 1 as well as the field oxide films 2a. A silicon nitride film 3b having a thickness of 150 nanometers is formed on an enitre surface of the silicon oxide film 2b by the low pressure chemical vapor deposition.

Figure 6J:
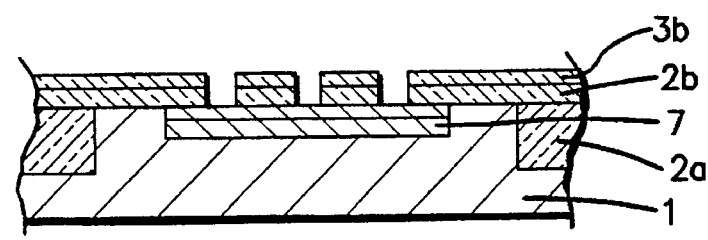

With reference to FIG. 6J, emitter and base contact holes are selectively formed in the silicon oxide film 2b and the silicon nitride film 3b to have parts of the Si epitaxial base layer 12 exposed.

Figure 6K:
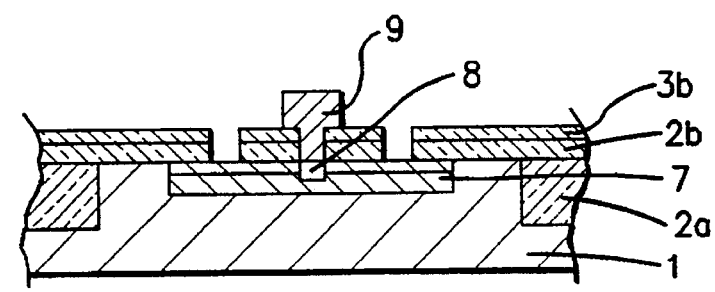

With reference to FIG. 6K, an As-doped polysilicon layer 9 is formed in the emitter contact. The As-doped polysilicon layer 9 is subjected to a thermal diffusion for diffusing As atoms from the As-doped polysilicon layer 9 into the exposed surface of the SiGe epitaxial base layer 7 thereby an As-diffusion region serving as an emitter region 8 is formed in the upper surface of the Si epitaxial base layer 12 just under the As-doped polysilicon layer 9. An emitter electrode not illustrated is formed on the As-doped polysilicon layer 9 so that the emitter electrode is electrically connected via the As-doped polysilicon layer to the emitter region 8. Base electrodes not illustrated are formed in the base contact holes so that the base electrodes are electrically connected to the Si epitaxial base region 12 on the SiGe epitaxial base layer 7 thereby resulting in the completion of the bipolar transistor.

As could be seen from the above description, the thickness of the SiGe epitaxial base layer 7 may readily be varied only by changing the depth of the recessed portion 5. This may permit the SiGe epitaxial base layer to have a sufficiently large thickness by forming the recessed portion 5 having a large depth. The increase in the thickness of the SiGe epitaxial base layer 7 by increase in the depth of the recessed portion 5 may reduce a resistance of the SiGe epitaxial base layer 7.

The silicon epitaxial layer 12 may serve to protect the SiGe epitaxial layer 7 from being etched by a later washing process. This may ensure the desired thickness of the SiGe epitaxial base layer 7.

The above novel bipolar transistor has a double base structure with a peripheral length 41.2 micrometers of the emitter region. It was confirmed that the base resistance of the novel bipolar transistor $r_b'=0.3$ ohms per an emitter electrode. The bipolar transistor with six emitters has a base resistance of 0.05 ohms and the noise figure NF=0.2 dB as well as shows a frequency f=2 GHz and also a collector current being a current when the noise figure NF is minimum, namely $\Gamma=\Gamma_{our}$. The noise figure is as low as GaAs heterojunction field effect transistor.

Whereas modifications of the present invention will no doubt be apparent to a person having ordinary skill in the art, to which the invention pertains, it is to be understood that embodiments shown and described by way of illustrations are by no means intended to be considered in a limiting sense. Accordingly, it is intended to cover by claims all modifications of the present invention which fall within the spirit and scope of the present invention.

What is claimed is:

1. A method for forming a base region of a bipolar transistor comprising the steps of:

selectively forming a recessed portion having a depth in an upper region of a semiconductor substrate acting as a collector region except for field oxide films selectively formed in said semiconductor substrate, said recessed portion being formed by etching using silicon oxide films and field oxide films as masks where said field oxide films extend over edges of upper portions of said semiconductor substrate; and selectively forming a base region which comprises a compound semiconductor epitaxial layer in said recessed portion and said compound semiconductor epitaxial layer having a thickness corresponding to said depth of said recessed portion formed in said semiconductor substrate so that said base region has a top surface positioned at the same level as a top surface of said semiconductor substrate, said base region comprising said compound semiconductor epitaxial layer being formed by the steps of:

depositing an SiGe layer on an entire surface of said substrate so that an SiGe epitaxial layer is grown in said recess portion and an SiGe polycrystalline layer is grown on said silicon oxide film;

depositing a silicon layer on an entire surface of said substrate so that a silicon epitaxial layer is grown on said SiGe epitaxial layer and a polysilicon layer is grown on said silicon oxide film; and removing said SiGe polycrystalline layer and said polysilicon layer so that said compound semiconductor epitaxial layer remains within said recessed portion.

2. The method as claimed in claim 1, wherein said recessed portion is formed by etching using a silicon nitride film pattern as a mask.

3. The method as claimed in claim 2, wherein said base region comprising said compound semiconductor epitaxial layer is formed by the steps of:

depositing a compound semiconductor layer on an entire surface of said substrate so that a compound semiconductor epitaxial layer is grown in said recessed portion and a compound semiconductor polycrystalline layer is grown on said silicon nitride film; and removing both said compound semiconductor polycrystal layer and said silicon nitride film so that said compound semiconductor epitaxial layer remains within said recessed portion.

4. The method as claimed in claim 1, wherein said base region comprising said compound semiconductor epitaxial layer is formed by the steps of:

depositing a compound semiconductor layer on an entire surface of said substrate so that a compound semiconductor epitaxial layer is grown in said recessed portion and a compound semiconductor polycrystalline layer is grown on said silicon oxide film; and removing said compound semiconductor polycrystal layer that said compound semiconductor epitaxial layer remains within said recessed portion.

5. The method as claimed in claim 4, wherein said compound semiconductor layer is a SiGe layer.

6. The method as claimed in claim 1, wherein said semiconductor substrate comprises a silicon substrate.

* * * * *